United States Patent
Kaylie et al.

(10) Patent No.: US 6,790,049 B2
(45) Date of Patent: Sep. 14, 2004

(54) MECHANICAL CASE FOR HOUSING ELECTRONIC PRODUCTS WITH INTEGRATED CONNECTOR

(75) Inventors: Harvey Kaylie, Brooklyn, NY (US); Guna Mandalap, Chennai (IN)

(73) Assignee: Scientific Components, Brooklyn, NY (US)

( * ) Notice: Subject to any disclaimer, the term of this patent is extended or adjusted under 35 U.S.C. 154(b) by 0 days.

(21) Appl. No.: 10/688,052

(22) Filed: Oct. 20, 2003

(65) Prior Publication Data

US 2004/0097105 A1 May 20, 2004

Related U.S. Application Data

(60) Provisional application No. 60/427,343, filed on Nov. 19, 2002.

(51) Int. Cl.[7] ............................................. H05K 1/00
(52) U.S. Cl. ..................................... 439/76.1; 333/100
(58) Field of Search ............................... 439/76.1, 521; 174/59, 60; 333/254, 260, 100

(56) References Cited

U.S. PATENT DOCUMENTS

| | | | | |
|---|---|---|---|---|
| 4,984,990 A | * | 1/1991 | Lindahl ........................ 439/63 |
| 5,505,636 A | * | 4/1996 | Blum ........................ 439/579 |
| 5,544,007 A | * | 8/1996 | Inoue ........................ 361/684 |
| 5,550,521 A | * | 8/1996 | Bernaud et al. ............ 333/260 |
| 5,581,134 A | * | 12/1996 | Romerein et al. ..... 307/132 M |
| 5,613,859 A | * | 3/1997 | Bellantoni et al. ............ 439/63 |
| 5,756,935 A | * | 5/1998 | Balanovsky et al. ....... 174/52.1 |
| 5,808,530 A | * | 9/1998 | Kalonji et al. .............. 333/260 |
| 5,823,791 A | * | 10/1998 | Bellantoni et al. ............ 439/63 |
| 5,828,272 A | * | 10/1998 | Romerein et al. .......... 333/100 |
| 5,856,768 A | * | 1/1999 | Hey-Shipton et al. .... 333/99 S |
| 5,906,512 A | * | 5/1999 | Reynolds .................... 439/579 |
| 5,909,154 A | * | 6/1999 | Brown et al. ................ 333/100 |
| 5,994,976 A | * | 11/1999 | Tang .......................... 333/100 |
| 6,018,278 A | * | 1/2000 | Tang .......................... 333/100 |
| 6,081,169 A | * | 6/2000 | Romerein et al. .......... 333/100 |
| 6,133,939 A | * | 10/2000 | Gresko et al. .............. 725/127 |
| 6,168,465 B1 | * | 1/2001 | Hirota ........................ 439/579 |
| 6,261,125 B1 | * | 7/2001 | Yeh .............................. 439/579 |
| 6,580,336 B1 | * | 6/2003 | Gerszberg et al. .......... 333/100 |
| 6,593,830 B2 | * | 7/2003 | Wu ............................. 333/100 |
| 6,626,352 B2 | * | 9/2003 | Li ............................... 228/245 |
| 6,642,447 B1 | * | 11/2003 | Mailloux ..................... 174/50 |
| 6,692,267 B1 | * | 2/2004 | Schmukler et al. ........ 439/76.1 |

* cited by examiner

Primary Examiner—Ross Gushi
(74) Attorney, Agent, or Firm—Kevin Redmond

(57) ABSTRACT

A package for containing an electronic circuit assembly. The package includes a housing having a bottom surface and walls extending upwardly from the bottom surface. The walls and the bottom surface define a cavity in the housing. The cavity holds the electronic circuit assembly. A post extends outwardly from the walls. The post is integrally formed with the housing. The post is connected to the wall on one end and a threaded annular sleeve portion is located at the other end. The threaded annular sleeve portion is adapted to receive a female connector portion. A bore passes through the post and the wall. The bore holds a feed through terminal. A cover is located over the cavity and is attached to the housing.

12 Claims, 11 Drawing Sheets

MECHANICAL CASE FOR HOUSING ELECTRONIC PRODUCTS WITH INTEGRATED CONNECTOR

This application claims the benefit of Provisional Application No. 60/427,343 filed Nov. 19, 2002.

BACKGROUND

1. Field of the Invention

This invention relates to electronic enclosures in general and more particularly to an electronic enclosure for high frequency microwave circuits that use coaxial connectors.

2. Description of Related Art

Referring to FIGS. 1–3, an electronic enclosure 20 of the prior art is shown. Enclosure 20 has a housing 22, top cover 24, bottom cover 26 and connectors 40. Housing 22 has four side walls 32 that surround a cavity 31. Housing 22 has four screw holes 33. The side walls 32 have a female threaded aperture 34 that extends entirely through the thickness of wall 32. The connectors 40 have a pair of male threaded ends 42, 43, a central nut portion 44, a pin 46 and an insulator 48. The connectors can be a conventional coaxial connector such as an SMA connector. The connector ends 43 mate with the threads of aperture 34 and are tightened in place using a wrench on nut portion 44. An electronic circuit assembly 52 such as a printed circuit board is located in cavity 31. Covers 24 and 26 have holes 25 for accepting a fastener such as a screw 50.

A typical assembly sequence of the prior art enclosure 20 is as follows:

1. A locking compound is placed on threads 43.
2. Connector 40 is screwed into apertures 34 of housing 22 and tightened.
3. The housing is placed into an oven to cure the locking compound at an elevated temperature.
4. Components are installed on electronic circuit assembly 52.
5. Circuit assembly 52 is placed into housing 22.
6. Pins 46 are soldered to pads on the circuit assembly 52.
7. Connector 40 is soldered to ground on circuit assembly 52.
8. Top cover 24 is then placed over housing 22 and fastened in place with screws 50.
9. Bottom cover 26 is then placed over housing 22 and fastened in place with screws 50.

The torque required to mount the connectors is an important parameter. The torque has to be high enough to prevent the SMA connector from detaching during the normal mating and un-mating process of the female end of the SMA connector (not shown). Normally, an organic locking compound such as Loctite is used on the threads 43 to obtain a high unscrewing torque and to keep connector 40 in place. Unfortunately, in high frequency applications, the locking compound may create continuity problems and degrade the electrical performance of the housing. Using screws to attach the connector to the housing is time consuming, uses manual labor and is expensive. In addition such a process is difficult to automate. Another problem with the current electronic enclosures such as housing 22 is that the threads in aperture 34 have to be precisely machined which adds to the cost of the housing. A further problem of enclosure 20 is that the individual component count is high which results in a large number of process steps during assembly.

While various electronic enclosures have been previously been used, they have suffered from having a high part count that is expensive to assemble and from continuity problems due to the use of locking compounds.

A current unmet need exists for an improved electronic enclosure that is low in cost, easy to assemble and high in reliability.

SUMMARY

It is a feature of the invention to provide a package for containing an electronic circuit assembly that is low in cost and requires fewer manufacturing steps.

Another feature of the invention is to provide a package for containing an electronic circuit assembly. The package includes a housing having a bottom surface and a plurality of walls extending upwardly from the bottom surface. The walls and the bottom surface define a cavity in the housing. The cavity is adapted to hold the electronic circuit assembly. A post extends outwardly from one of the walls. The post is integrally formed with the housing. The post has a first end and a second end. The first end is connected to the wall. A threaded annular sleeve portion is located at the second end of the post. The threaded annular sleeve portion is adapted to receive a female connector portion. A bore passes through the post and the wall. The bore is adapted to receive a terminal. A cover is located over the cavity and is attached to the housing.

BRIEF DESCRIPTION OF THE DRAWINGS

It is noted that the drawings of the invention are not to scale. In the drawings, like numbering represents like elements between the drawings.

DETAILED DESCRIPTION

Figure 1:
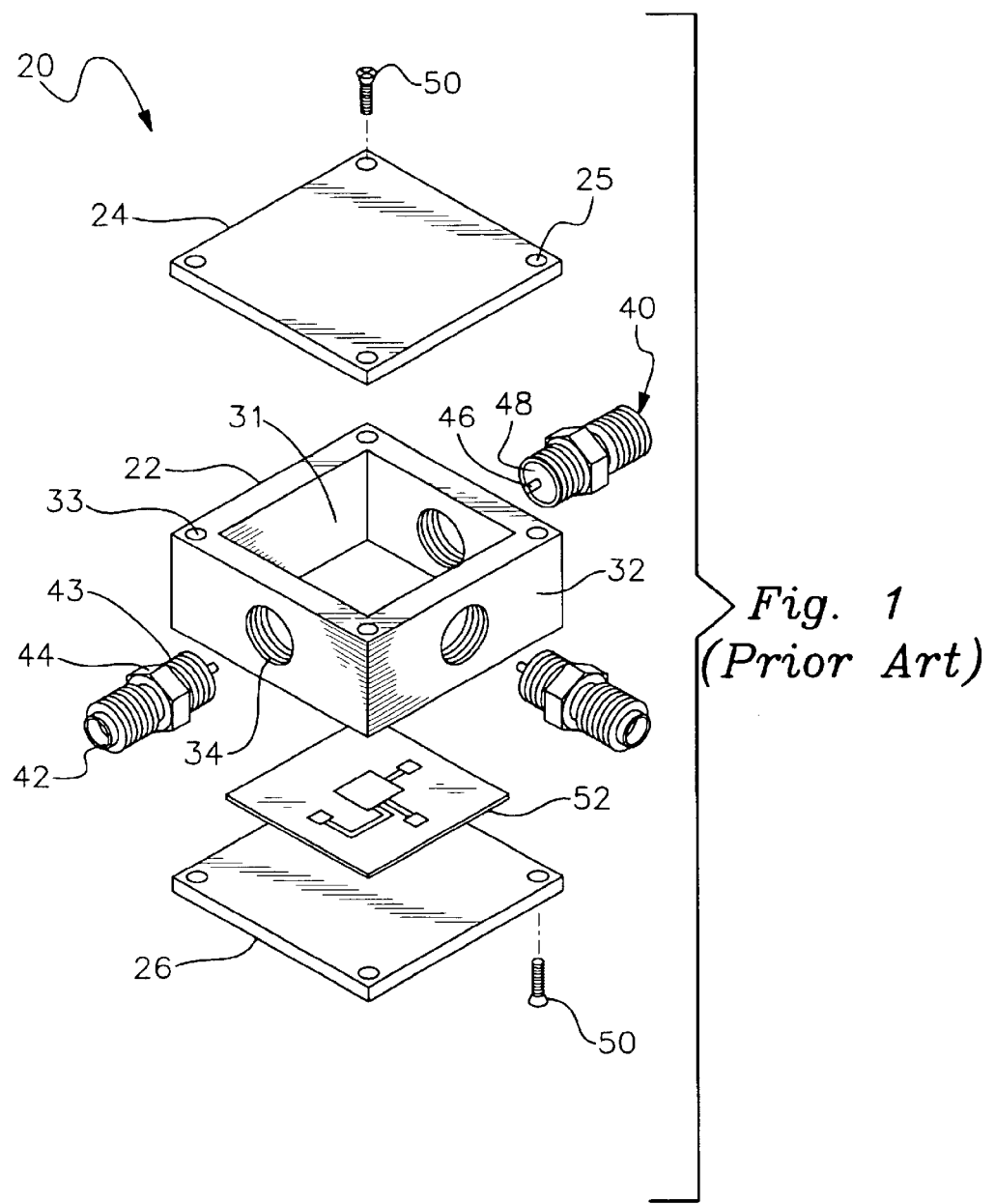
FIG. 1 is a perspective view of a prior art electronic enclosure.
Figure 2:
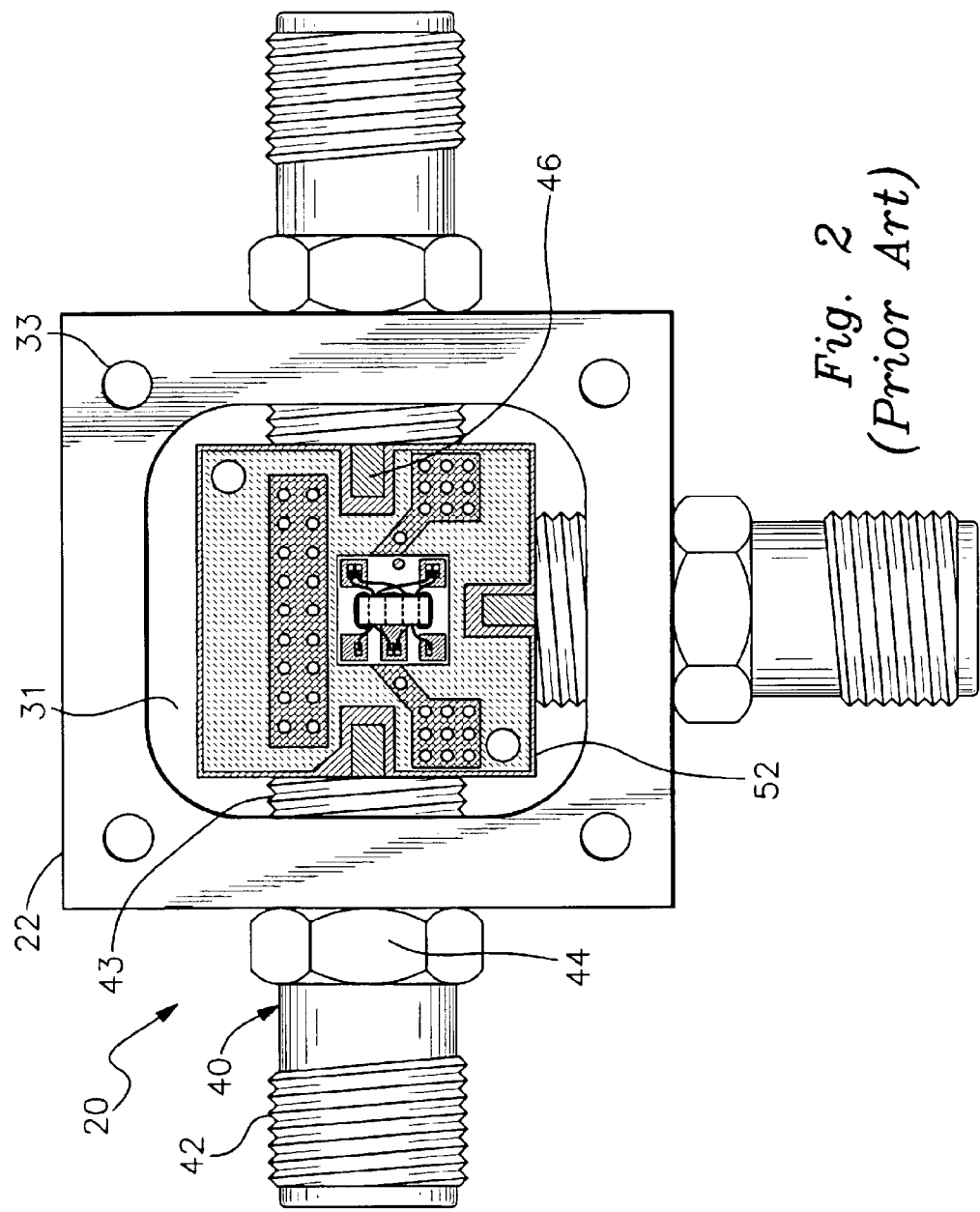
FIG. 2 is a top view of a FIG. 1.
Figure 3:
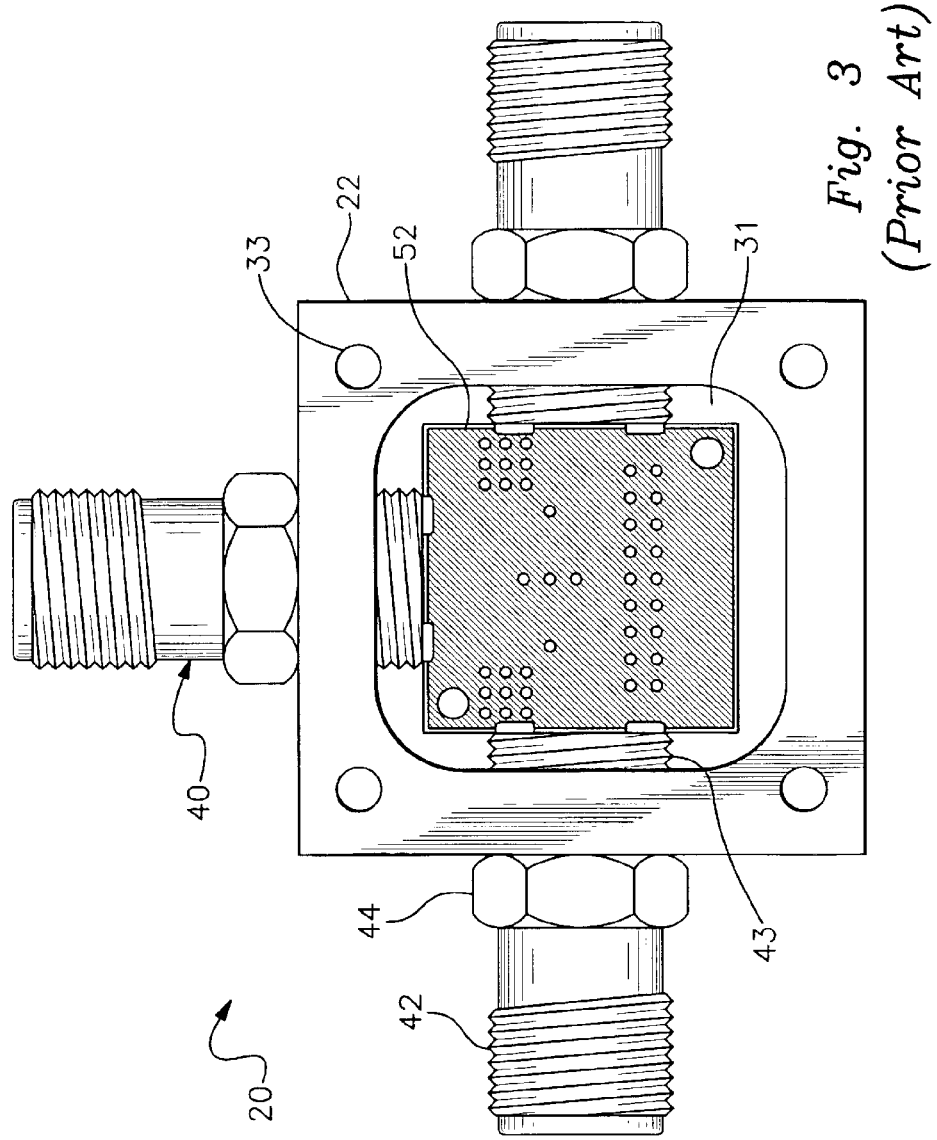
FIG. 3 is a bottom view of FIG. 1.
Figure 4:
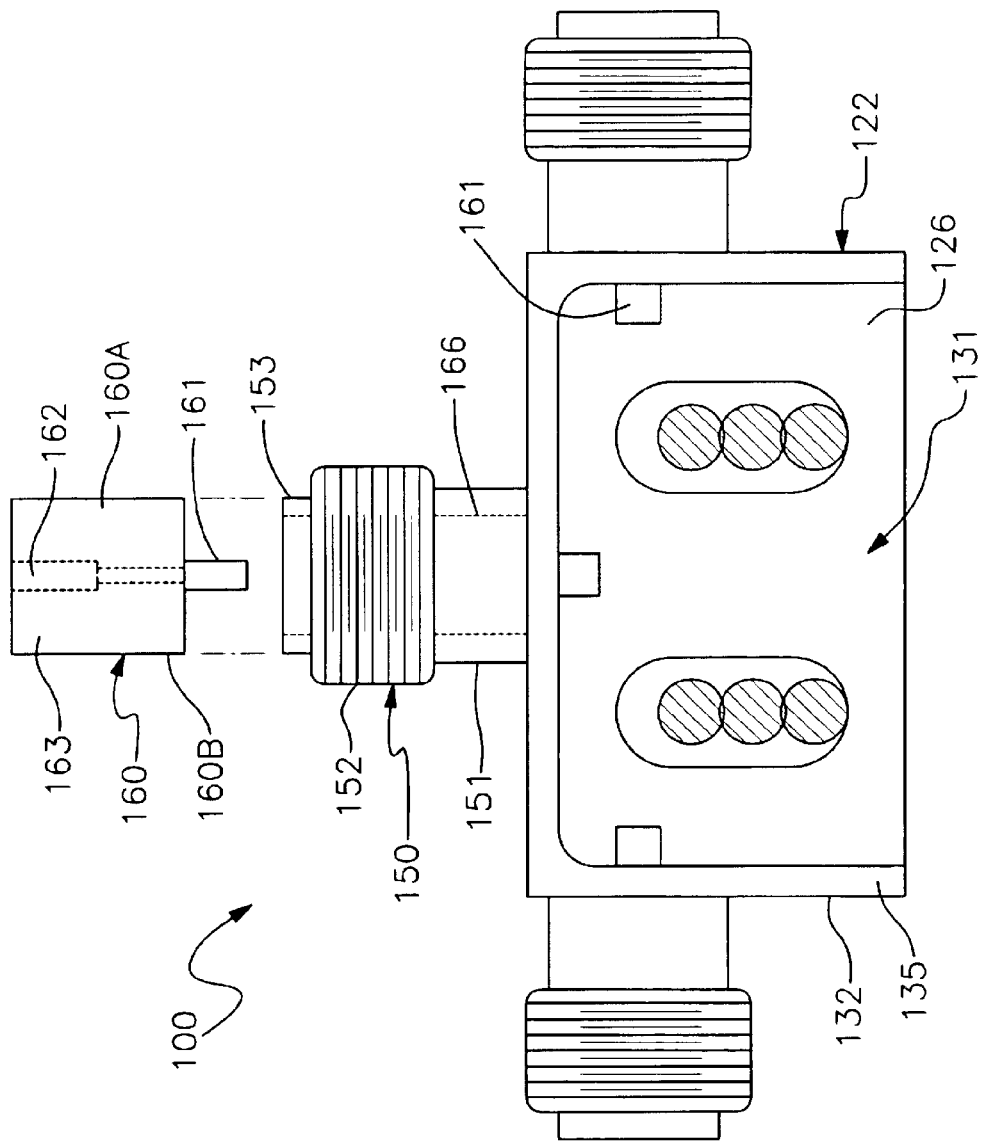
FIG. 4 is a top view of the housing of the present invention.
Figure 5:
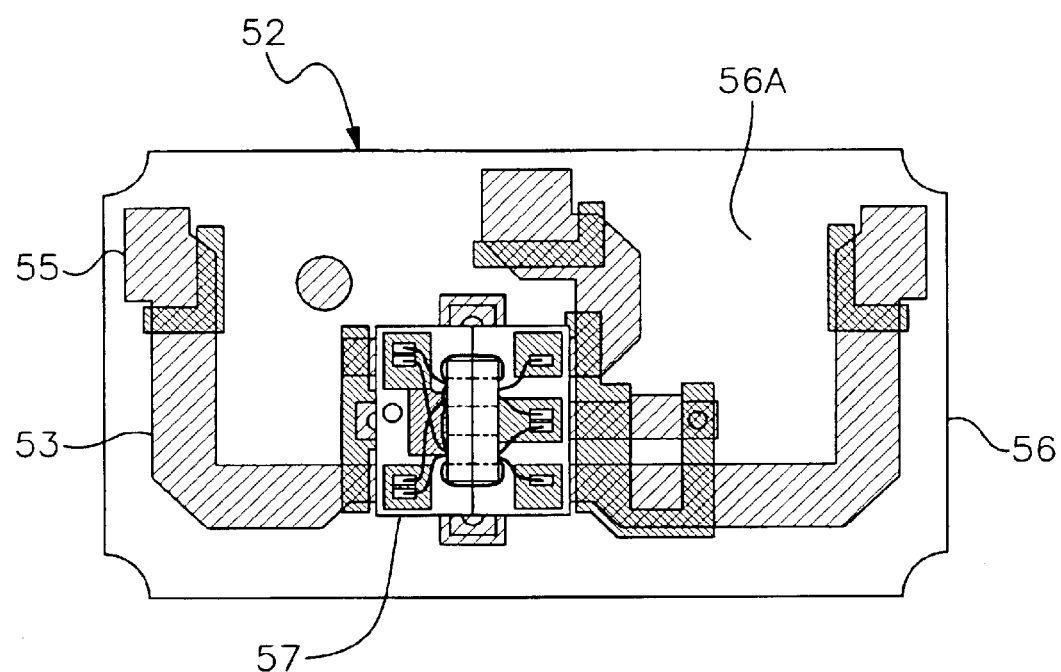
FIG. 5 is a top view of an electronic circuit assembly.
Figure 7:
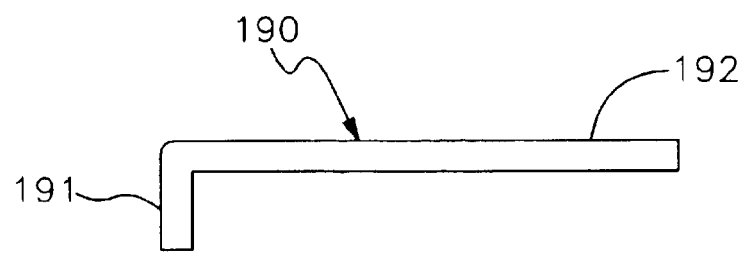
FIG. 7 is a side view of a cover.
Figure 6:
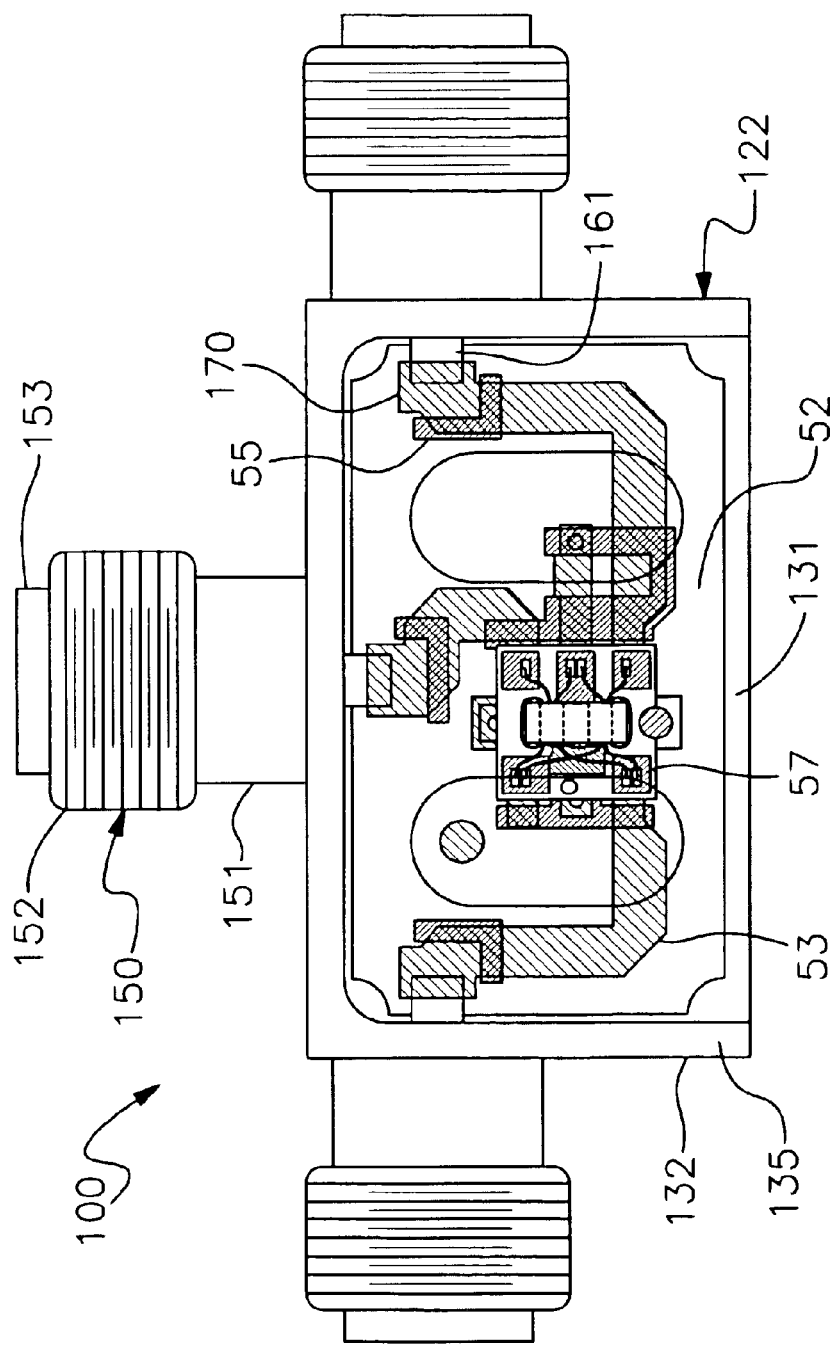
FIG. 6 is a top view of the electronic circuit assembly of FIG. 5 mounted in the housing of FIG. 4.

Referring to FIGS. 4–7, a package or electronic enclosure 100 for containing an electronic circuit assembly is shown. Electronic enclosure 100 has a machined metal housing 122. Housing 122 can be machined out of aluminum or other suitable metals. Housing 122 can also be plated with gold for corrosion resistance. Housing 122 has three side walls 132 that surround a bottom surface 126 and cavity 131. Side walls 132 have an upper surface 135. A pair of grooves 136 are located in bottom surface 126. Grooves 136 are adapted to accept solder paste 137 during assembly. Three mounting posts 150 extend from and are integrally formed with side walls 132. Posts 150 have an end 151 that is connected to wall 132 and another end 153. A threaded annular sleeve portion 152 is located adjacent end 153. The threaded annular sleeve portion 152 has male threads and is adapted to connect with the female threads of a conventional SMA connector (not shown). The SMA connector can be mounted to a cable or to another housing.

A bore 166 passes through post 150 and wall 132. The bore is adapted to receive a feed through terminal 160. Terminal 160 is press fit into bore 166. The friction between bore 166 and terminal 160 keeps the terminal in place. Terminal 160 has ends 160A and 160B. A metal pin 161 extends from end 160B of the terminal. Pin 161 is electrically connected to a receptacle 162 at end 160A. An insulator 163 surrounds pin 161 and receptacle 162. Insulator 163 insulates pin 161 and receptacle 163 from bore 166.

An electronic circuit assembly 52 such as a printed circuit board is located in cavity 131 and rests on bottom surface 126. Electronic circuit assembly 52 has a substrate 56 with an upper surface 56A and a lower surface 56B. Lower surface 56B preferably has an exposed copper area. Solder paste 137 is reflowed in order to attach the exposed copper area to bottom surface 126. In this manner, the housing 122 is electrically grounded to circuit assembly 52. Electronic circuit assembly 52 has circuit lines 53, connection pads 55 and a semiconductor device 57. The circuit lines 53 electrically connect the connection pads 55 to semiconductor device 57. A reflowed solder paste 170 attaches pins 161 to pads 55. An L-shaped metal cover 190 is located over the cavity and circuit assembly and is attached to the housing by a fastener. The L-shaped metal cover 190 has ends 191 and 192. Cover 190 seals cavity 131. End 191 forms a side wall for cavity 131.

A typical assembly sequence for enclosure 100 is as follows:

1. Solder paste 137 is dispensed onto grooves 136 of bottom 126.
2. The electronic circuit assembly 52 is placed onto bottom 126 in cavity 131. This provides the ground connection between the circuit assembly and the housing.
3. Solder paste is dispensed onto pins 161 and component locations on substrate 56.
4. Enclosure 100 is placed into a reflow oven where the solder paste is reflowed.
5. L-shaped cover 190 is then placed over housing 122 and fastened in place with a fastener.

Electronic enclosure 100 has an integrated connector. The three mounting posts 150 that extend from the housing are machined out of an integral block of material. Metal material such as aluminum is preferred. After machining, the housing can be gold plated for better electrical performance and for corrosion resistance. The gold plating provides for improved shielding from electromagnetic coupling and interference. Since, the mounting posts 150 are integrally formed with housing 122, they cannot be loosened or become unscrewed like the connectors of the prior art. The bottom of the housing is also integral with the housing and is machined at the same time. The use of enclosure 100 results in four fewer parts being needed than in the prior art designs.

Several variations can be made to enclosure 100 in order to adapt it to various product types. For example, if one of the connectors 150 is removed and a feed through terminal 160 is used, enclosure 100 can house an amplifier. By removing two of the connectors 150 and using two feed through terminals 160, enclosure 100 can house an oscillator. If three additional feed through terminals 160 are added, enclosure 100 can house a single pole double throw switch with a driver. By eliminating a connector 150, enclosure 100 can house an attenuator. If different types of connectors are used on each side of housing 122, enclosure 100 can be an adapter-attenuator. If connector 150 has a different impedance at each end, such as 50 ohm on one end and 75 ohm on the other end, enclosure 100 can be used to house impedance matched transformers. Enclosure 100 can also have different shapes. For example, if posts 150 are placed inline, the housing can have a tubular shape.

Figure 8:
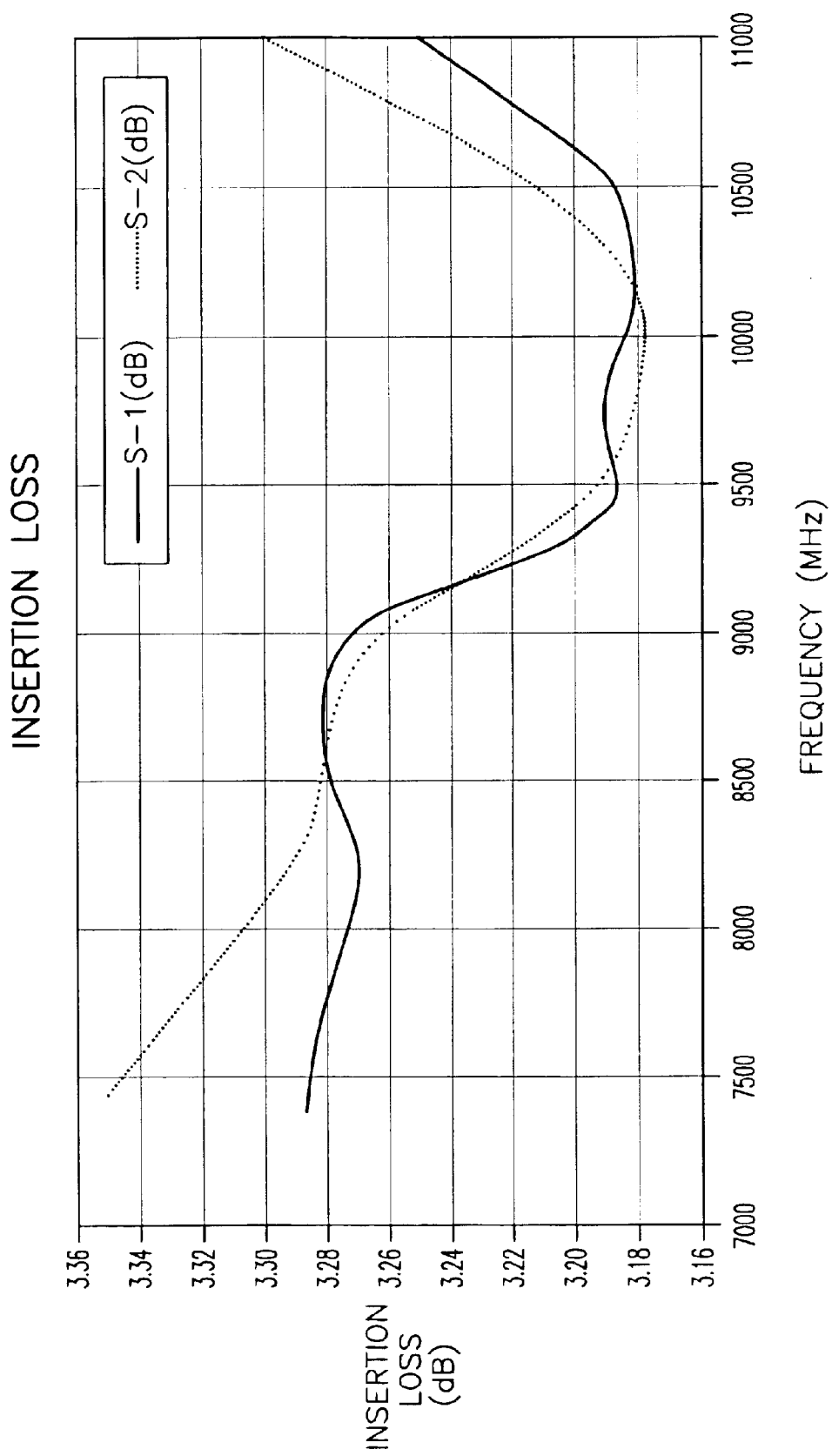
FIG. 8 is a graph of insertion loss versus frequency for a power splitter mounted in the present invention.
Figure 9:
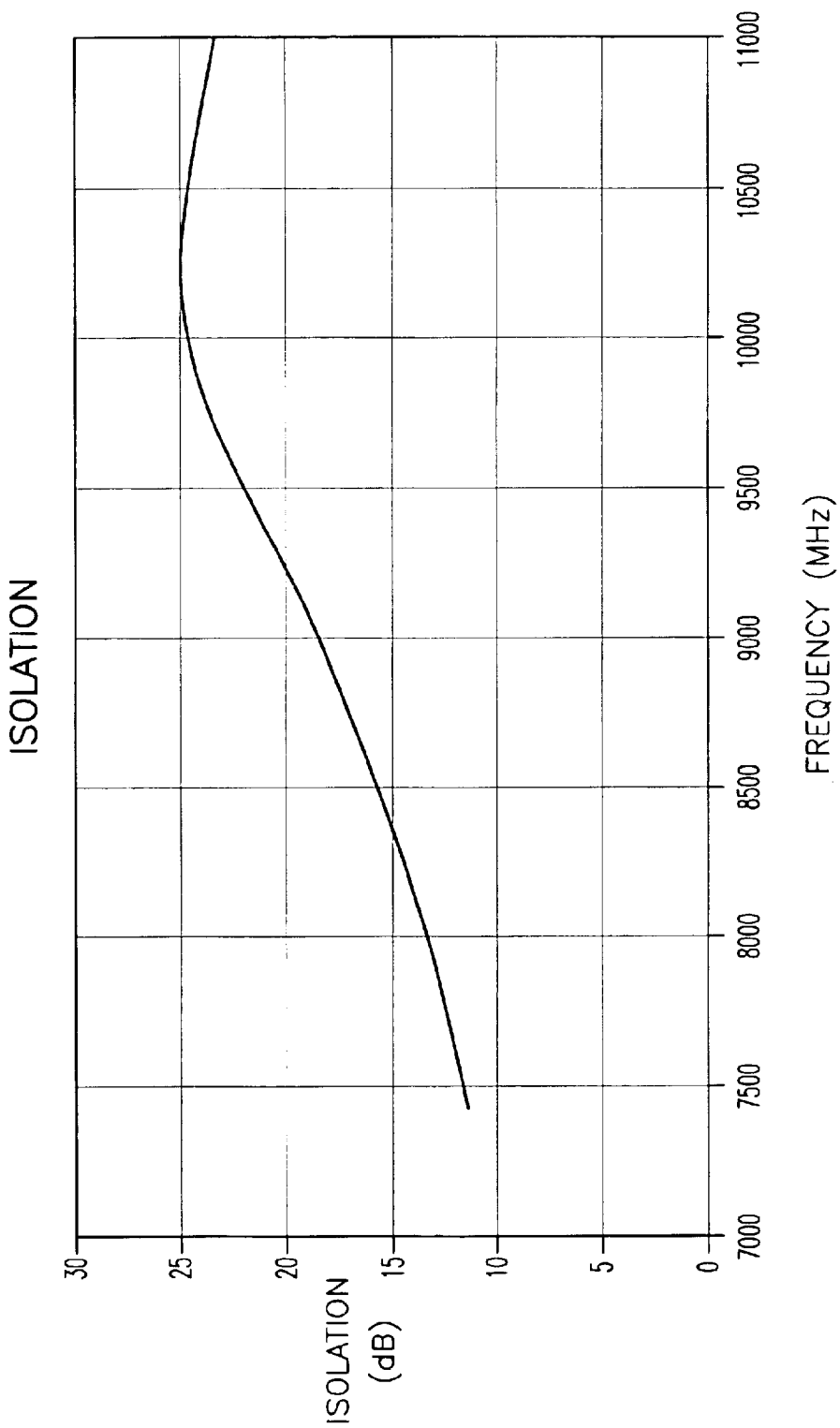
FIG. 9 is a graph of isolation versus frequency for a power splitter mounted in the present invention.
Figure 10:
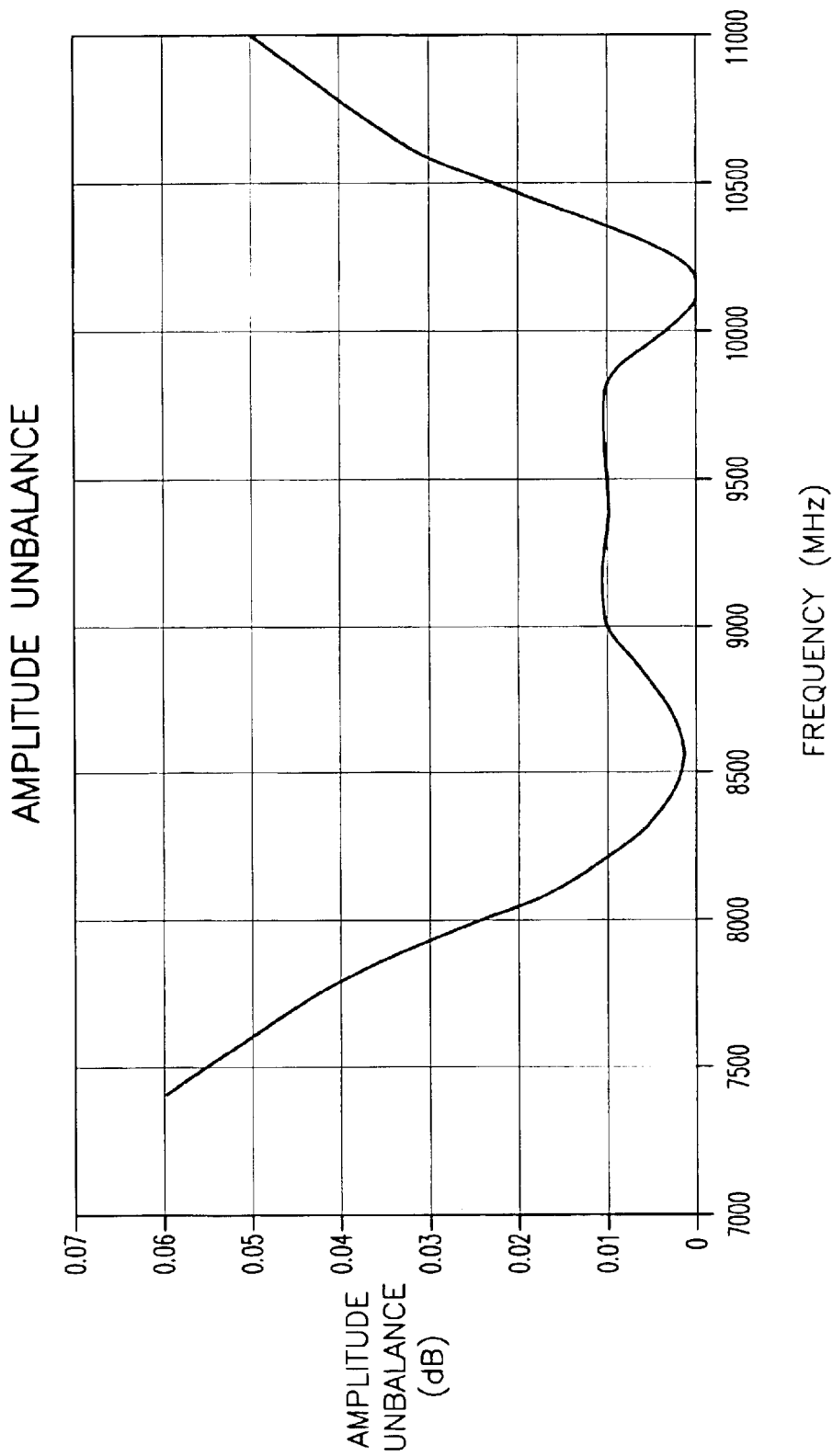
FIG. 10 is a graph of amplitude imbalance versus frequency for a power splitter mounted in the present invention.
Figure 11:
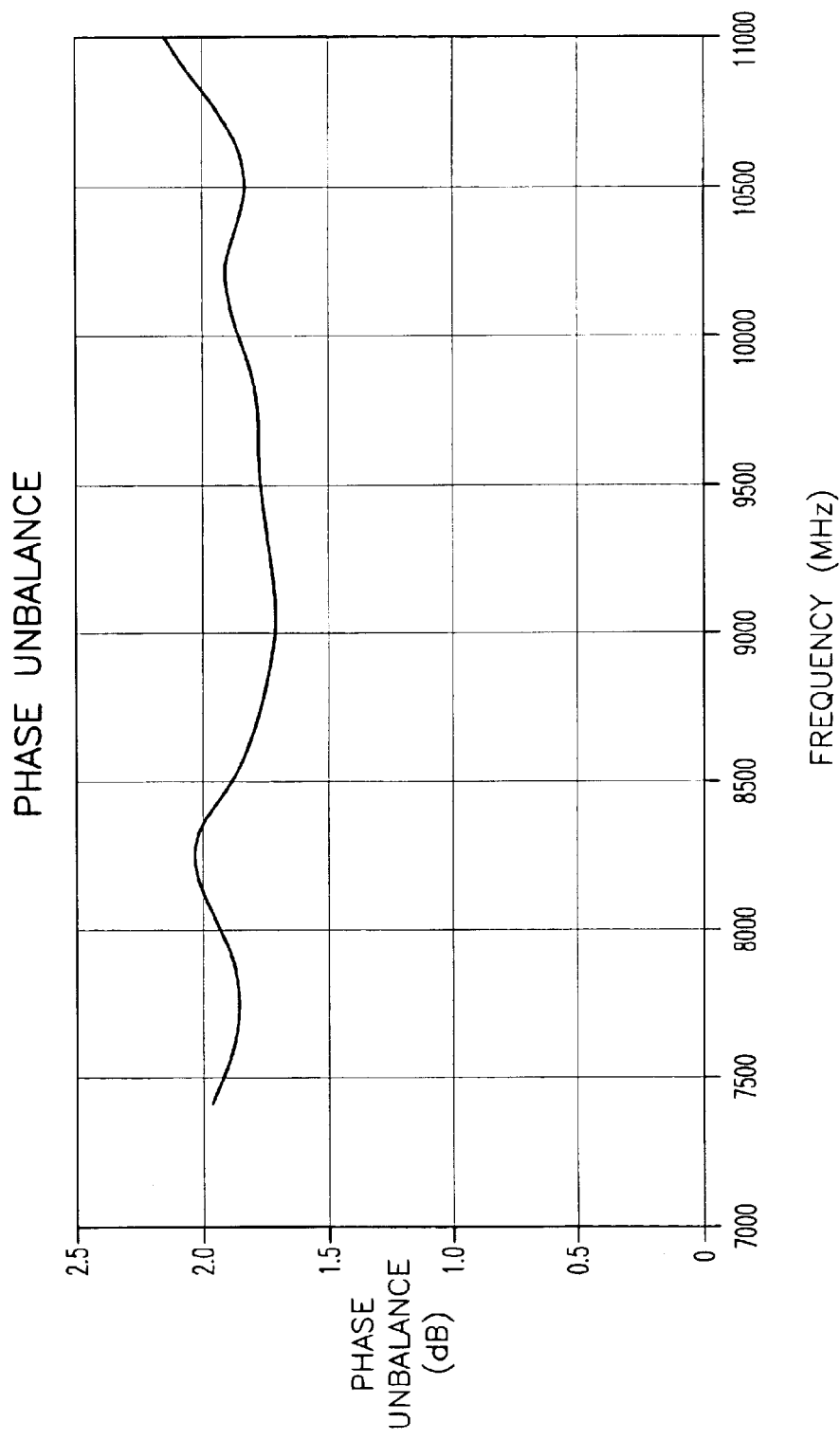
FIG. 11 is a graph of phase imbalance versus frequency for a power splitter mounted in the present invention.
Figure 12:
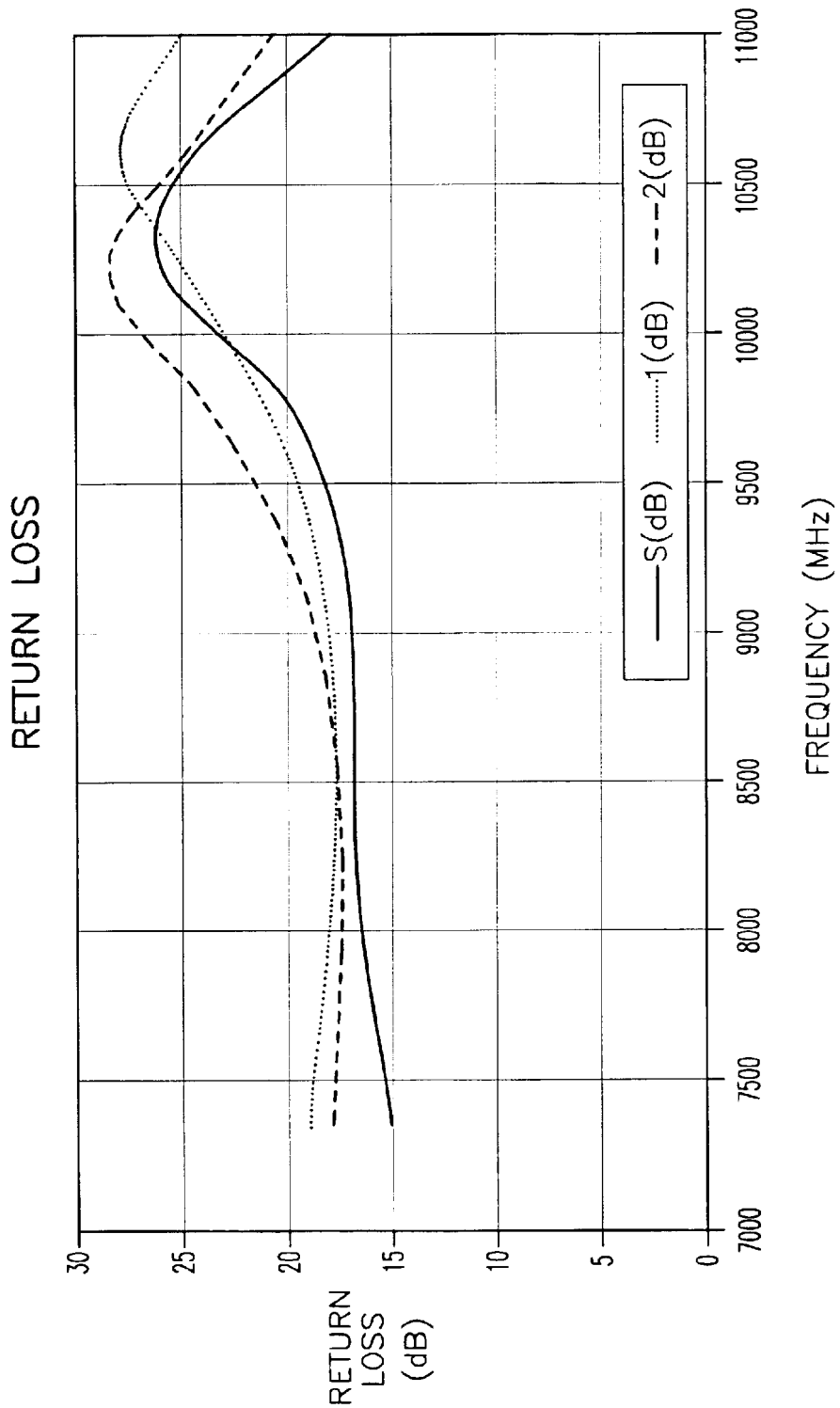
FIG. 12 is a graph of return loss versus frequency for a power splitter mounted in the present invention.

Turning now to FIGS. 8–12, measured electrical parameters are shown for a high frequency Wilkinson power splitter mounted in electronic enclosure 100. The power splitter was operated between 7.4 and 11 giga-hertz. FIG. 8 shows a graph of insertion loss versus frequency for a power splitter mounted in the present invention. FIG. 9 is a graph of isolation versus frequency. FIG. 10 is a graph of amplitude imbalance versus frequency. FIG. 11 is a graph of phase imbalance versus frequency. FIG. 12 is a graph of return loss versus frequency for a power splitter mounted in the present invention. As can be seen in the graphs, the electrical performance of the power splitter mounted in electronic enclosure 100 is excellent. Low insertion loss, return loss and excellent amplitude and phase balance is due to the excellent continuity from the post to the housing and from the housing to the circuit assembly ground.

The present invention has several advantages. The continuity problems of the prior art are eliminated because of the elimination of the locking compound previously used. The electronic enclosure of the present invention is low in cost and easy to assemble because fewer parts are required. Electronic enclosure 100 has improved reliability because the mounting posts 150 are integrally formed with housing 122. The posts cannot become loose or unscrewed as in the devices of the prior art.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A package for containing an electronic circuit assembly, the package comprising:
    a) a housing having a bottom surface and a plurality of walls extending upwardly from the bottom surface, the walls and the bottom surface defining a cavity in the housing, the cavity being adapted to hold the electronic circuit assembly;
    b) at least one post extending outwardly from one of the walls, the post being integrally formed with the housing, the post having a first end and a second end, the first end connected to the wall;
    c) a threaded annular sleeve portion located at the second end of the post, the threaded annular sleeve portion adapted to receive a female connector portion;
    d) a bore passing through the post and the wall, the bore adapted to receive a feed through terminal, the feed through terminal having a pin located on one end and a receptacle located on another end;
    e) an insulator located in the bore surrounding the feed through terminal;

f) at least one groove located in the bottom surface of the housing;

g) a reflowed solder paste contained within the groove, the reflowed solder paste electrically connecting the electronic assembly to the housing; and h) a cover mounted over the cavity and connected to the housing.

2. The package according to claim 1, wherein the pin is soldered to the electronic circuit assembly.

3. The package according to claim 1, wherein the electronic circuit assembly is a printed circuit board.

4. The package according to claim 1, wherein the housing and cover are formed from metal.

5. The package according to claim 1, wherein the housing and cover are connected together by a fastener.

6. A electronic enclosure for containing an electronic circuit assembly comprising:

a) a housing having a bottom surface and a plurality of walls extending upwardly from the bottom surface, the walls having an inner wall surface and an outer wall surface, the inner wall surfaces and the bottom surface defining a cavity in the housing, the cavity being adapted to hold the electronic circuit assembly;

b) a plurality of posts extending perpendicularly from the outer wall surfaces, each post having a first end and a second end, the first end of the post connected to the outer wall surface;

c) a threaded annular sleeve portion surrounding the post and located toward the second end, the threaded annular sleeve portion adapted to receive a female connector portion;

d) a bore extending from the inner wall surface through the wall, the post and terminating at the second end;

e) a feed through terminal located in the bore, the feed through terminal including a pin surrounded by an insulator;

f) a groove located in the bottom surface;

g) a printed circuit board mounted in the cavity, the printed circuit board having a top surface and a metallized bottom surface, the metallized bottom surface located adjacent the groove;

h) a solder connection located within the groove between the bottom surface of the housing and the metallized bottom surface of the printed circuit board; and i) a cover located over the cavity and attached to the housing.

7. The package according to claim 6, wherein the pin is soldered to the top surface of the printed circuit board.

8. The package according to claim 6, wherein the housing and posts are formed from a single piece of material.

9. The package according to claim 8, wherein the single piece of material is metal.

10. The package according to claim 8, wherein the single piece of material is machined to form the housing and posts.

11. The package according to claim 6, wherein the cover is L-shaped and extends over the cavity and one of the walls.

12. A method of making an electronic package, the method comprising:

a) providing a housing having a bottom surface and a plurality of walls extending upwardly from the bottom surface, the walls and the bottom surface defining a cavity, the housing having a plurality of posts extending from the wall, the post having a threaded sleeve portion and a bore extending through the post, the bottom surface having a groove;

b) providing a printed circuit board having a circuitized top surface and a metallized bottom surface;

c) dispensing a solder paste into the groove;

d) placing the printed circuit board into the cavity and over the groove such that the metallized bottom surface is in contact with the solder paste;

e) reflowing the solder paste such that an electrical contact is formed between the housing and the metallized bottom surface;

f) inserting a feed through terminal into the bore, the feed through terminal having a pin end and a receptacle end;

g) soldering the pin end to the circuitized top surface;

h) placing a cover over the cavity; and i) attaching the cover to the housing.

\* \* \* \* \*